May 21, 1957 N. E. LINDENBLAD 2,793,243
THERMOELECTRIC ELEMENT ALLOY
Filed Oct. 15, 1954
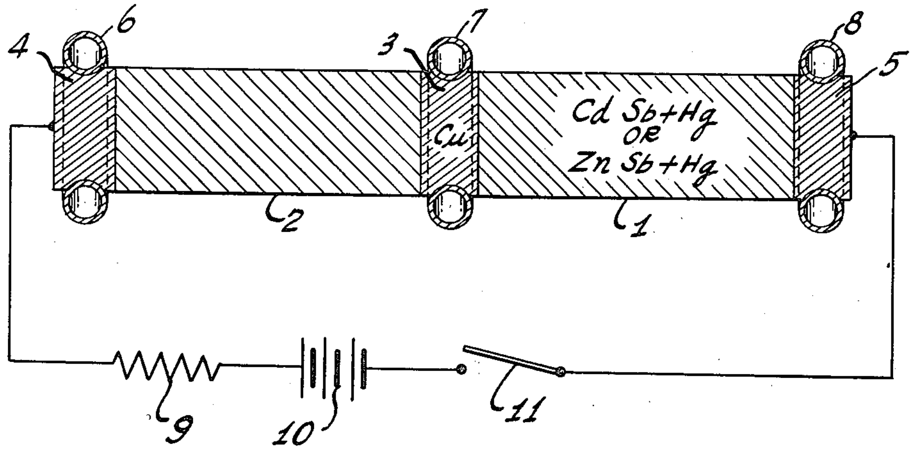
INVENTOR.
NILS E. LINDENBLAD
BY J. L. Whittaker
ATTORNEY 2,793,243

THERMOELECTRIC ELEMENT ALLOY

Nils E. Lindenblad, Princeton, N. J., assignor to Radio Corporation of America, a corporation of Delaware Application October 15, 1954, Serial No. 462,497

5 Claims. (Cl. 136—5)

This invention relates to improved thermoelectric elements and more particularly to novel alloys useful in thermoelectric devices comprising single or multiple junctions between different metals. Such elements used as part of an electric circuit generate an electric current when the junction has a temperature different from the rest of the circuit or they generate heat or cold at the junction when a current of one or the other direction is passed through the circuit.

One object of the instant invention is to provide improved thermoelectric alloys and elements made of such alloys.

Another object is to provide improved thermoelectric alloys of relatively great physical strength which may be easily prepared and readily connected in an electric circuit.

The intermetallic compounds CdSb and ZnSb are known to have exceptionally high thermoelectric E. M. F.'s, CdSb being somewhat better than ZnSb in this regard. The effective thermoelectric powers of these compounds are maximized when their compositions depart by a small amount, up to about 2 wgt. percent from perfect stoichiometry and when they are alloyed with 2% to 5% of mercury. Bodies made of these compositions, however, are relatively brittle and are not physically strong. Further, it is exceedingly difficult to make satisfactory electrical connections to such bodies. Special solder compositions which have been suggested for this purpose generally make high resistance seals to these alloys and decrease the thermoelectric efficiencies of devices utilizing them.

The instant invention provides improved thermoelectric materials having effective thermoelectric powers fully comparable to the thermoelectric powers of the best previously known materials. In addition, the materials of the invention are relatively simple to prepare, have relatively great physical strength and may be connected in an electrical circuit by simple, well-known soldering techniques.

The compositions within the scope of the instant invention fall within the following range:

| | Weight percent |
|---|---|
| Antimony | 62 to 72 |
| Zinc | 19 to 26 |
| Cadmium | 8.5 to 11 |
| Mercury | 0 to 1 |

All the compositions within the scope of the invention are relatively simple to prepare, being subject to very little variation in phase composition due to variations in cooling.

The invention will be described in greater detail with reference to the accompanying drawing of which the single figure is a schematic, cross-sectional, elevational view of a thermoelectric element according to the invention.

The element shown in the drawing is composed of two thermoelectrically differential members 1 and 2 which are conductively joined by an intermediate conductive part 3 of slight or negligible thermoelectric power. The member 1 consists of an alloy of 67.4 wgt. percent Sb, 23.1 wgt. percent Zn, 9.3 wgt. percent Cd and 0.2 wgt. percent Hg. The member 2 may consist of any desired thermoelectric composition complementary to the alloy such as, for example, lead telluride. The intermediate part 3 which connects differential members to form a thermoelectric junction between them consists preferably of copper. It serves as a terminal for the generated cold and may be contacted by a pipe coil 7 to conduct a fluid coolant to a distant location. Alternatively, the member may be shaped as a thin vane or other structure for cooling only in its immediate environment.

An energizing circuit comprising a current source 10, a resistor 9 and a control switch 11 is connected to the element through copper end terminals 4 and 5. The end terminals are provided with single turn pipe coils 6 and 8 through which a heat transporting fluid may be pumped to maintain them at a relatively constant temperature. Thus, when the action of the current through the thermoelectric junction produces a temperature differential between the intermediate terminal 3 and the end terminals, the end terminals may be maintained at a constant temperature and the intermediate one may be reduced in temperature.

The compositions according to the instant invention are of the so-called p-type thermoelectric class, i. e., when they are connected in an electric circuit an applied potential will produce heating at the electrically negative connection and cooling at the positive connection.

A preferred embodiment of the invention comprises an alloy of the following composition:

| | Weight percent |
|---|---|
| Antimony | 67.4 |
| Zinc | 23.1 |
| Cadmium | 9.3 |
| Mercury | 0.2 |

This alloy in thermoelectric junction with lead, a neutral material, has an effective thermoelectric power ($e'$) of about 125 microvolts per degree centigrade. The alloy has relatively great physical strength and electrical connections may be made to it directly by simple soldering using any of the common solders and solder fluxes such as 50–50 tin-lead solder and a rosin or zinc-chloride flux.

Other specific compositions within the scope of the invention exhibit properties similar to those of the preferred embodiment except that their effective thermoelectric powers are somewhat lower.

The principal effect of mercury in the compositions is two-fold. First, in the preparation of the material the mercury appears to facilitate the mixing of the ingredients acting possibly as a flux. Second, the presence of mercury increases both the conductivity and the thermoelectric E. M. F., thus providing a significant increase in the effective thermoelectric power of the material. Those compositions of the invention that do not include mercury have an effective thermoelectric power of about 115 $\mu$ v./° C. Optimum improvement is provided when mercury is added to the composition in a proportion of about 0.2 wgt. percent. Increased proportions of mercury provide only insignificant thermoelectric changes but tend to embrittle and to weaken the compositions. Mercury, therefore, in proportions greater than about 1 wgt. percent is not recommended.

There have thus been described improved thermoelectric elements of novel compositions which possess exceptionally high thermoelectric powers, relatively great physical strength and which are readily connected in electrical circuits.

What is claimed is:

1. A thermoelectric alloy consisting essentially of:

| | Weight percent |
|---|---|
| Antimony | 62 to 72 |
| Zinc | 19 to 26 |
| Cadmium | 8.5 to 11 |
| Mercury | up to 1 |

2. A thermoelectric alloy consisting essentially of:

| | Weight percent |
|---|---|
| Antimony | 67.4 |
| Zinc | 23.1 |
| Cadmium | 9.3 |
| Mercury | 0.2 |

3. A thermoelectric element comprising two circuit members of thermoelectrically complementary materials, said members being conductively joined to form a thermoelectric junction, one of said two members consisting essentially of an alloy of:

| | Weight percent |
|---|---|
| Antimony | 62 to 72 |
| Zinc | 19 to 26 |
| Cadmium | 8.5 to 11 |
| Mercury | up to 1 |

4. A thermoelectric element comprising two circuit members of thermoelectrically complementary materials, said members being conductively joined to form a thermoelectric junction, one of said two members consisting essentially of an alloy of:

| | Weight percent |
|---|---|
| Antimony | 67.4 |
| Zinc | 23.1 |
| Cadmium | 9.3 |
| Mercury | 0.2 |

5. A thermoelectric element comprising two circuit members of mutually complementary thermoelectric materials, a heat absorbing element of good conductivity conductively joined intermediate said thermoelectric members to form together therewith a thermoelectric junction, one of said thermoelectric members consisting essentially of the following alloy:

| | Weight percent |
|---|---|
| Antimony | 62 to 72 |
| Zinc | 19 to 26 |
| Cadmium | 8.5 to 11 |
| Mercury | up to 1 |

References Cited in the file of this patent

UNITED STATES PATENTS

| | | |
|---|---|---|
| 425,568 | Edelkamp | Apr. 15, 1890 |
| 483,782 | Giraud | Oct. 4, 1892 |
| 669,425 | McAdams | Mar. 5, 1901 |
| 2,280,137 | Wiegand | Aug. 4, 1939 |
| 2,250,842 | Roberts | July 29, 1941 |